United States Patent
Khaselev et al.

(10) Patent No.: US 8,312,623 B2
(45) Date of Patent: Nov. 20, 2012

(54) METHODS FOR PRODUCING ELECTRICAL CONDUCTORS

(75) Inventors: Oscar Khaselev, Monmouth Junction, NJ (US); Nitin Desai, Princeton Junction, NJ (US); Michael T. Marczi, Chester, NJ (US); Bawa Singh, Voorhees, NJ (US)

(73) Assignee: Fry's Metals, Inc., South Plainfield, NJ (US)

( * ) Notice: Subject to any disclaimer, the term of this patent is extended or adjusted under 35 U.S.C. 154(b) by 1232 days.

(21) Appl. No.: 12/052,166

(22) Filed: Mar. 20, 2008

(65) Prior Publication Data

US 2008/0236874 A1 Oct. 2, 2008

Related U.S. Application Data

(60) Provisional application No. 60/908,882, filed on Mar. 29, 2007.

(51) Int. Cl.
*H05K 3/02* (2006.01)
(52) U.S. Cl. ............... 29/846; 29/825; 29/830; 29/832; 29/840; 29/852
(58) Field of Classification Search .............. 29/825, 29/830, 832, 840, 846, 852
See application file for complete search history.

(56) References Cited

U.S. PATENT DOCUMENTS

| 4,747,968 | A | | 5/1988 | Gilleo | |
|---|---|---|---|---|---|
| 5,853,652 | A | * | 12/1998 | Schildgen et al. | 264/614 |
| 6,074,893 | A | * | 6/2000 | Nakata et al. | 438/106 |
| 6,797,367 | B2 | * | 9/2004 | Ogawa et al. | 428/209 |
| 7,334,324 | B2 | * | 2/2008 | Ogawa et al. | 29/848 |
| 7,743,493 | B2 | * | 6/2010 | Uchikoba | 29/846 |

FOREIGN PATENT DOCUMENTS

| EP | 08251016 | 7/2008 |
|---|---|---|
| JP | 01332403 | 11/2001 |
| WO | 0248432 | 6/2002 |

OTHER PUBLICATIONS

Database WPI Week, 200217, Thomson Scientific, London, GB; AN 2002-127442 XP002487301.

* cited by examiner

*Primary Examiner* — Carl Arbes
(74) *Attorney, Agent, or Firm* — Lando & Anastasi, LLP

(57) ABSTRACT

A device including a heat sensitive substrate and an electrical conductor disposed thereon is provided. In certain examples, the heat sensitive substrate may be configured to degrade at or above a sintering temperature. In other examples, the electrical conductor may be processed, prior to disposal on the heat sensitive substrate, at the sintering temperature on a second substrate that can withstand the sintering temperature. Methods and kits are also disclosed.

11 Claims, 5 Drawing Sheets

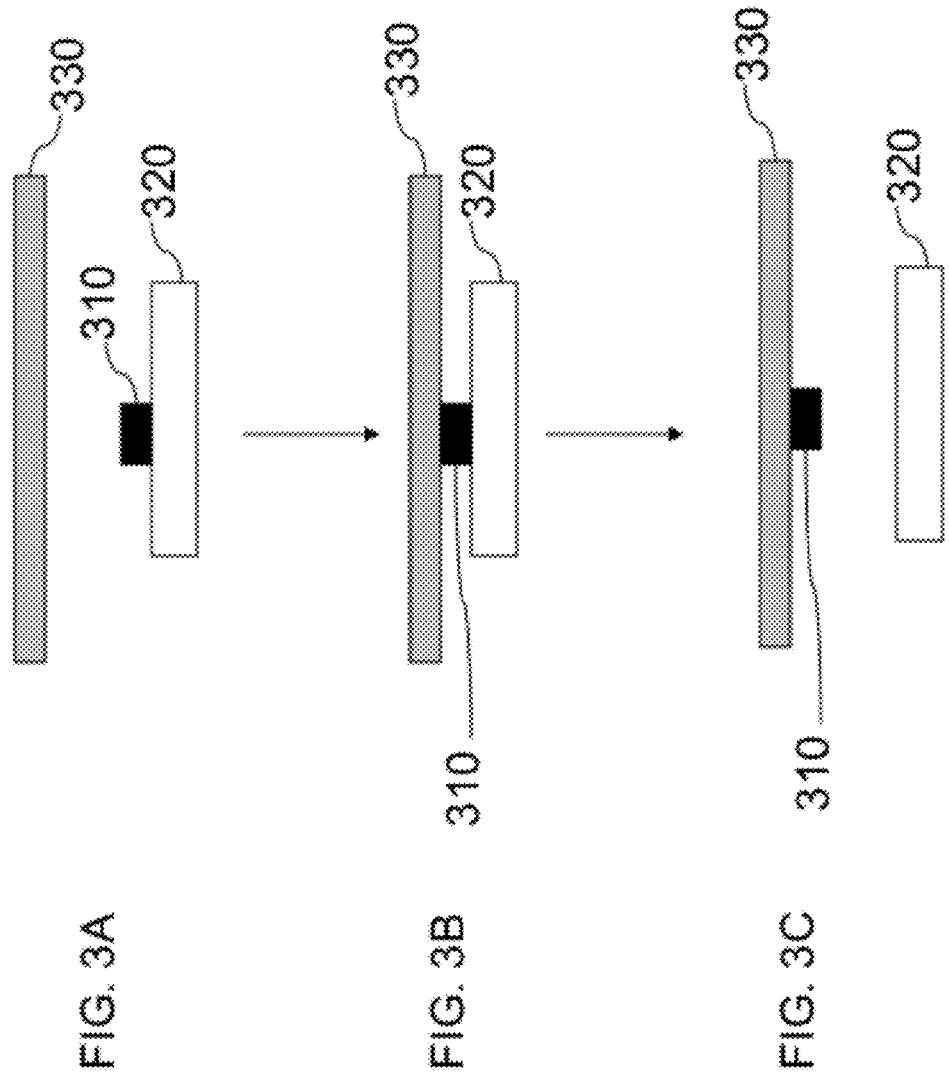

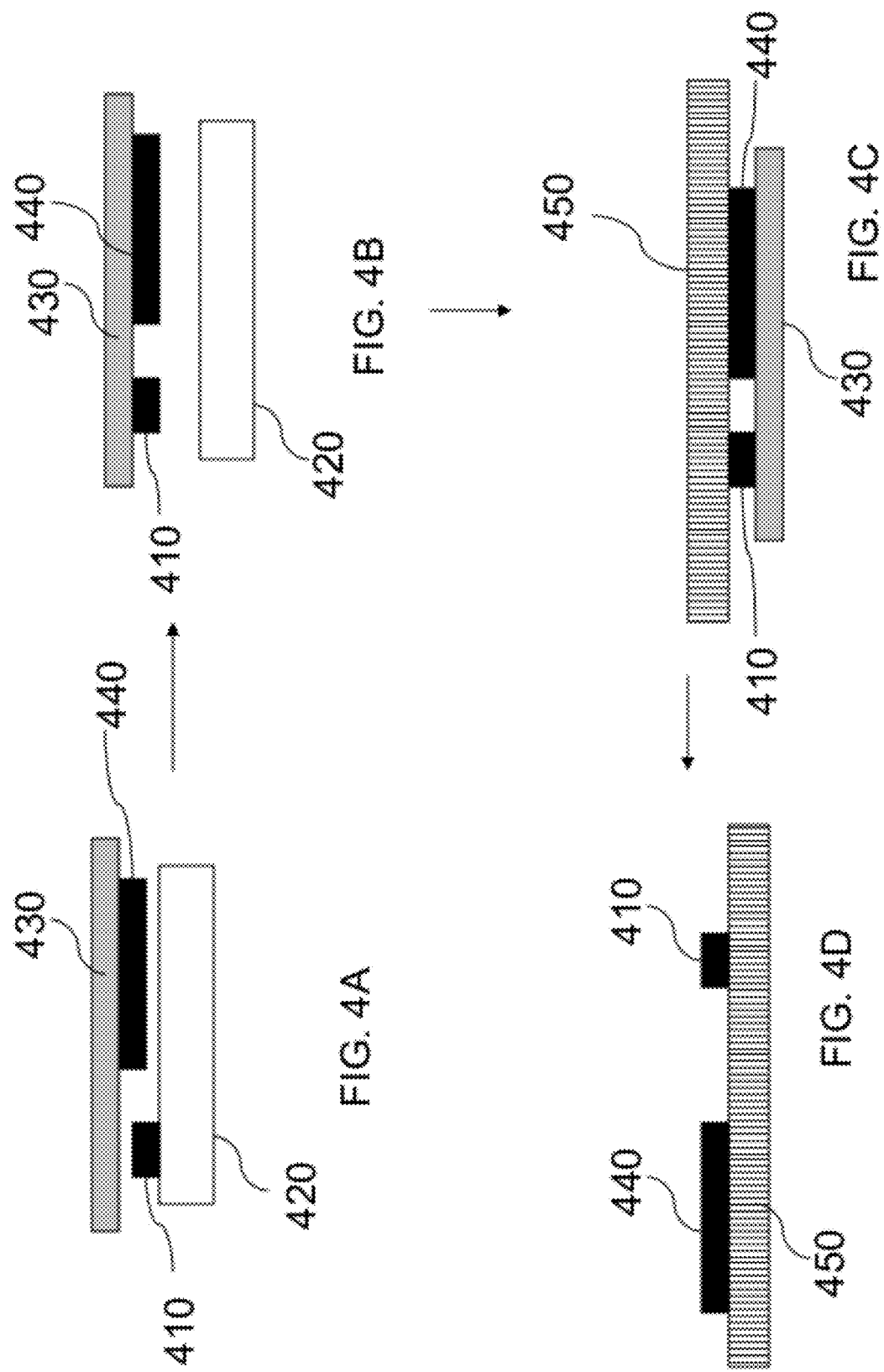

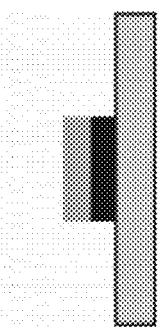
FIG. 5A Printing
FIG. 5B Sintering
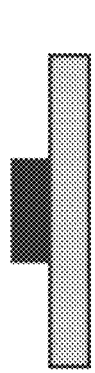
FIG. 5C Release (0.1 M H₂SO₄)
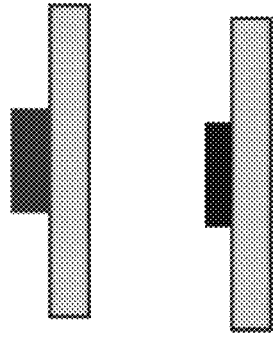
FIG. 5D Electroplate/Release (CuSO₄)
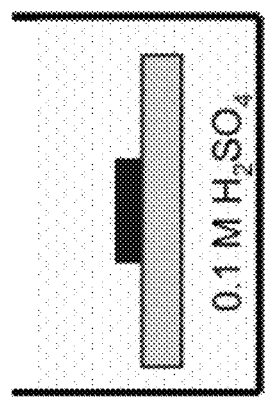
FIG. 5E Transfer by lamination
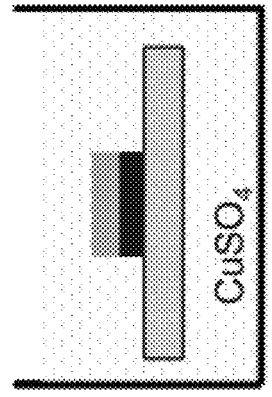
FIG. 5F Final structure

METHODS FOR PRODUCING ELECTRICAL CONDUCTORS

PRIORITY CLAIM

This application claims priority to U.S. Provisional Application No. 60/908,882 filed on Mar. 29, 2007, the entire disclosure of which is hereby incorporated herein by reference for all purposes.

TECHNOLOGICAL FIELD

Examples of the technology disclosed herein relate generally to methods and devices for providing electrical conductors on heat sensitive substrates.

BACKGROUND

Many electrical devices include heat sensitive components or heat sensitive features. Heating of the heat sensitive components may result in damage to the components and render such components inoperable for their intended purpose. Fabrication of devices that include heat sensitive components presents unique challenges.

SUMMARY

In accordance with a first aspect, a device comprising a heat sensitive substrate and an electrical conductor disposed on the heat sensitive substrate is provided. In certain examples, the heat sensitive substrate may be configured to degrade at or above a sintering temperature. In some examples, the electrical conductor may be processed, prior to disposal on the heat sensitive substrate, at a sintering temperature on a second substrate that can withstand the sintering temperature.

In certain embodiments, the heat sensitive substrate may comprise one or more materials selected from the group consisting of polymer films (such as, for example, PE, PP, ABC, etc) paper, and cloth. In some examples, the electrical conductor may comprise at least one material selected from the group consisting of silver, gold, copper, nickel, platinum, palladium and iron. In certain examples, the electrical conductor may have an electrical resistance less than or equal to 4 microOhms-cm. In other examples, the electrical conductor may comprise a metal or a metal salt mixed with a capping agent. In additional examples, the device may further comprise a material electrodeposited on the electrical conductor. In some examples, the electrodeposited material may be one or more materials selected from the group consisting of copper, silver, gold, nickel, and tin. In certain examples, the device may further comprise an adhesive between the electrical conductor and the heat sensitive substrate. In other examples, the electrical conductor may be laminated to the heat sensitive substrate.

In accordance with another aspect, a method of producing an electrical conductor on a heat sensitive substrate is disclosed. In some examples, the method may comprise disposing a conductive material on a first substrate capable of withstanding a sintering temperature, sintering the conductive material at the sintering temperature to form an electrical conductor, and transferring the electrical conductor to a heat sensitive substrate that degrades at or above the sintering temperature.

In certain embodiments, the method may further comprise producing the conductive material by mixing a metal or a metal salt with a capping agent. In some examples, the conductive material may be produced using a single phase solution. In other examples, the disposing step may comprise at least one of spin coating, inkjet printing, screen printing, paste printing or combinations thereof. In certain examples, the method may further comprise releasing the electrical conductor from the first substrate prior to transferring the electrical conductor to the heat sensitive substrate. In additional examples, the releasing step comprises exposing the electrical conductor to an acidic solution. In other examples, the releasing step comprises exposing the electrical conductor to a basic solution. In some examples, the transferring step may comprise laminating the electrical conductor to the heat sensitive substrate. In other examples, the transferring step may comprise adhering the electrical conductor to the heat sensitive substrate using a material. In additional examples, the method may further comprise electrodepositing an additional material onto the electrical conductor. In certain examples, the method may further comprise releasing the electrodeposited, electrical conductor from the first substrate prior to transferring the electrodeposited, electrical conductor to the heat sensitive substrate.

In accordance with an additional aspect, a kit to produce an electrical conductor is disclosed. In certain examples, the kit may comprise a first substrate configured to withstand a sintering temperature, a heat sensitive substrate configured to degrade at or above the sintering temperature, an ink comprising metal particles in a carrier selected to deposit a conductive material onto at least a portion of the first substrate, and instructions for using the first substrate, the heat sensitive substrate, and the ink to produce an electrical conductor on the heat sensitive substrate. In some examples, the metal particles may be capped or uncapped metal particles.

Additional aspects, features, embodiments and examples are described in more detail below.

BRIEF DESCRIPTION OF THE FIGURES

Certain examples are described below in reference to the figures in which:

FIGS. 3A-3C schematically illustrate a process for producing an electrical conductor on a heat sensitive substrate, in accordance with certain examples;

FIGS. 4A-4D schematically illustrate a process for producing an electrical conductor using an intermediate substrate, in accordance with certain examples;

FIGS. 5A-5F schematically illustrate a process for producing an electrical conductor, in accordance with certain examples.

Figure 2:
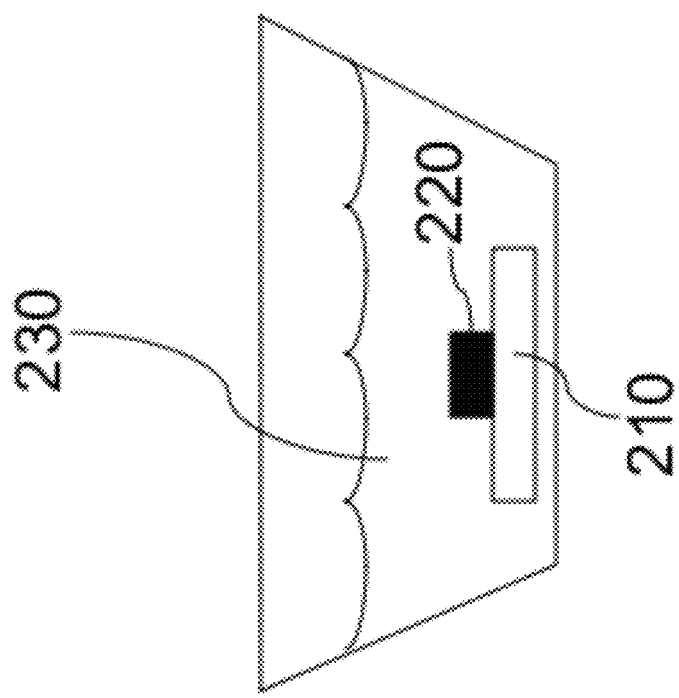
FIG. 2 is a schematic of an assembly comprising an electrical conductor disposed on a substrate, wherein the assembly is placed in an electrolyte bath, in accordance with certain examples.

The conductors, substrates and other features shown in the figures are not necessarily drawn to scale. One or more components may have been enlarged, distorted or otherwise shown in a non-conventional or non-proportionate manner to facilitate a better understanding of the technology disclosed herein.

DETAILED DESCRIPTION

Certain embodiments of the technology described herein provide advantages over existing devices and methods including, but not limited to, the ability to produce devices having low electrically resistive conductors on a heat sensitive substrate. In some examples, the devices including a heat sensitive substrate may be produced in a suitable manner such that any damage to the heat sensitive substrate is avoided or minimized. As used herein, the term "dispose" is intended to be interchangeable with the term "deposit" or similar terms.

In accordance with certain examples, the devices, kits and methods disclosed herein may be used to produce many different types of electrical devices including, but not limited to, printed electronics, RFID antennas, embedded resistors, printed circuit boards, electrical interconnects, solar cell contacts and other articles including one or more electrical circuits. Additional electrical devices that may be produced using the devices, kits and methods disclosed herein will be readily selected by the person of ordinary skill in the art, given the benefit of this disclosure.

In accordance with certain examples, silver inks and pastes currently available for printed electronics are limited mainly by epoxy (or other organic filler) base systems. The advantage of such inks and pastes is a low sintering temperature (often less then 150° C.) which allows them to be used on heat sensitive substrates like plastics and polymers. However epoxy based system have a relatively high electrical resistance due to the presence of the organic binders (about 10 milliOhm-cm). In contrast, newer classes of materials permit fabrication of fine electrical circuitry with a very low resistance. Such materials are, for example, metal particles, metallic nano-powders and metal-organic inks, such as those described in commonly assigned patent application bearing Ser. No. 11/462,089 and titled "PARTICLES AND INKS AND FILMS USING THEM" and filed on Aug. 3, 2006, the entire disclosure of which is hereby incorporated herein by reference for all purposes. These materials can produce electrical lines with a very low electrical resistance, e.g., 3-4 microOhm-cm or less.

In certain examples, to achieve such low electrical resistance, the materials are desirably sintered at temperatures as high as 300° C. Most heat sensitive substrates degrade at sintering temperatures. As used herein, a "heat-sensitive substrate" is a substrate that degrades, or includes a heat sensitive feature or component that degrades, in some manner at a sintering temperature such that at least some portion of the substrate, or a component or feature thereon, is damaged or rendered inoperable for its intended use. In some examples, the sintering temperature is at least 200-300° C., more particularly, at least 250° C., e.g., 285° C. or more. In certain embodiments discussed below, the electrical conductor is sintered on a different substrate prior to deposition on the heat sensitive substrate such that a heat sensitive substrate comprising a low electrical resistance conductor is provided.

In accordance with certain examples, a device comprising a heat sensitive substrate configured to degrade at or above a sintering temperature, and an electrical conductor disposed on the heat sensitive substrate is provided. In some examples, the electrical conductor may be configured to be processed, prior to disposal on the heat sensitive substrate, at the sintering temperature on a second substrate that can withstand the sintering temperature. The use of a second or a processing substrate permits sintering of the material used in the conductor, which can decrease the overall electrical resistance of the conductor. For example, a substrate that can withstand high sintering temperatures may be used to sinter the electrical conductor, and the electrical conductor may subsequently be transferred or otherwise moved to the heat sensitive substrate.

In certain examples, the heat sensitive substrate may be, or may include, one or more materials that melts, cracks or otherwise degrades at a sintering temperature. Illustrative heat sensitive materials include, but are not limited to, certain polymers and plastics such as, for example, polyethylene, polycarbonate, epoxy and many other polymers. In an alternative configuration, the heat sensitive substrate may not be heat sensitive itself but may include heat sensitive features on the substrate that precludes its use at a sintering temperature. Such heat sensitive features include, but are not limited to, plastic encapsulations or housings, electrical insulation, epoxy filling or adhesives Additional heat sensitive materials and heat sensitive features may also be found in devices such as, for example, printed circuit boards, solar cells, RFID antenna, OLEDs and other devices that may benefit from the devices and methods disclosed herein.

In accordance with certain examples, the substrate used to sinter the electrical conductor may include, or be made from, any material that can withstand the sintering temperature used to sinter the electrical conductor. In some examples, the substrate used to sinter the electrical conductor may be unaltered after the sintering process, whereas in other examples, the substrate may be altered but is not damaged or affected to such a degree that the sintering of the electrical conductor is disrupted or altered. In certain examples, the sintering substrate may be, or may include, glass, silicon, aluminum, titanium, alumina and other ceramics.

In accordance with certain examples, the electrical conductor of the devices disclosed herein may include one or more materials that can be sintered to decrease the overall electrical resistance of the conductor (or increase the overall electrical conductivity of the conductor). Illustrative materials include, but are not limited to, metals such as, for example, silver, gold, copper, nickel, platinum, palladium, iron, alloys thereof and combinations thereof. In certain examples after sintering, the electrical conductor has an electrical resistance of les than or equal to 4 microOhms-cm. The use of electrical conductors with such low electrical resistances on heat sensitive substrates provides significant benefits not previously achieved.

In accordance with certain examples, the electrical conductor disposed on the sintering substrate may be a metal particle or a nanoink such as, for example, those described in U.S. Ser. No. 11/462,089 incorporated by reference above. In certain examples, a metal or metal salt may be mixed with and a capping agent in a single phase solution. In certain examples, the metal or metal salt may be selected from conductive metals or conductive metal salts including, for example, transition metals or transition metal salts of gold, silver, copper, nickel, platinum, palladium, iron, and alloys thereof. The exact form of the metal or metal salt may vary depending on the selected solvent system. It is desirable that the metal salt dissolve in the selected solvent system without undue heating that could result in evaporation of the solvent. Illustrative anions of the metal salts include nitrate, chloride, bromide, iodide, thiocyanate, chlorate, nitrite, and acetate. Additional anions will be selected by the person of ordinary skill in the art, given the benefit of this disclosure.

In certain examples, the use of a single phase solution to produce the particles for use in the electrical conductors permits omission of a phase transfer reagent (though a phase transfer reagent may still be used in certain embodiments) that is commonly used to produce particles in a polyol process. By performing the reaction in a single phase, the ease of producing the particles increases, and the cost of producing the particles decreases. In addition, large scale, industrial synthesis of the particles may be achieved using a single phase reaction. Additional benefits of the particles, and methods of producing them, will be readily selected by the person of ordinary skill in the art, given the benefit of this disclosure.

In accordance with certain examples, the metal used to provide the particles for use in the electrical conductors may be uncomplexed or may be complexed with one or more ligands. For example, the metal may be complexed with EDTA, ethylenediamine, oxalate, 2,2'-bypyridine, cyclopentadiene, diethylenetriamine, 2,4,6,-trimethylphenyl, 1,10-phenanthroline, triethylenetetramine or other ligands. In certain examples, the metal or metal salt may be dissolved in a solvent or a solvent system to provide a clear, but not necessarily colorless, solution. For example, a suitable amount of metal or metal salt may be added to a solvent such that when the metal or metal salt goes into solution, the overall solution is clear. The overall solution may be colored or may be colorless. Suitable solvents include, but are not limited to, ethylene glycol, methanol, ethanol, propanol, isopropanol, butanol, isobutyl alcohol, pentanol, isopentanol, hexanol and aliphatic alcohols having from about 1 to about 10 carbon atoms. Additional suitable solvents include, but are not limited to, benzene, toluene, butylenes, polyisobutylene, Isopar® solvents commercially available from Exxon and aromatic compounds having aliphatic side chains that include 2-6 carbon atoms. Suitable solvent systems include mixtures of the illustrative solvents discussed herein and other fluids that are soluble, miscible or partially miscible with such illustrative solvents. In certain examples, the combination of solvents provides a single phase. To achieve a single phase when using a mixture of solvents, the amounts of each solvent may be adjusted such that a single phase results when the solvents are mixed. Should more than one phase be present upon mixing, the relative amounts of one or more of the solvents can be altered, e.g., increased or decreased, until a single phase is observed.

In accordance with certain examples, the metal particles may be mixed with a capping agent. The capping agent may be effective to isolate the particle and limit the size of its growth. In certain examples, the capping agent may be a high molecular weight capping agent, e.g., has a molecular weight of at least about 100 g/mol. Illustrative capping agents include, but are not limited to, organic amines having 12 or more carbon atoms. In certain examples, the organic amine has at least 16 carbon atoms, e.g., hexadecylamine. The organic moiety of the amine may be saturated or unsaturated and may optionally include other functionalities such as, for example, thiols, carboxylic acids, polymers, and amides. Another group of illustrative capping agents suitable for use with the metals of the electrical conductors disclosed herein are thiols having 12 or more carbon atoms. In certain examples, the thiol has at least 6 carbon atoms. The organic moiety of the thiol may be saturated or unsaturated and may optionally include other functionalities such as, for example, pyrrole and the like. Another group of capping agents suitable for use are pyridine based capping agent such as, for example, triazolopyridine, terpyridine and the like. Additional suitable capping agents will be readily selected by the person of ordinary skill in the art, given the benefit of this disclosure.

In certain examples where a capping agent is used with metal particles to provide an electrical conductor, the capping agent may be dissolved in a suitable solvent prior to addition to the metal solution. For example, the capping agent may be dissolved in a solvent and the solution can be mixed with the metal solution. In other examples, the capping agent may be added as a solid or liquid directly to the metal solution without prior dissolution in a solvent. The capping agent may be added, for example, in incremental steps or may be added in a single step. In certain examples, the exact amount of capping agent added to the metal solution may vary depending on the desired properties of the resulting capped particles. In some examples, a suitable amount of capping agent is added to provide at least about 2% by weight capping agent in the capped particles. It will be recognized by the person of ordinary skill in the art, given the benefit of this disclosure, that it may be desirable to use more or less capping agent depending on the desired properties of the particles. For example, to increase the conductivity of particles disposed on a substrate, e.g., a printed circuit board, it may be desirable to adjust the amount of capping agent until the conductivity is optimized or falls within a desired range. It will be within the ability of the person of ordinary skill in the art, given the benefit of this disclosure, to select suitable amounts of capping agent.

In certain examples, when a capping agent (or a capping agent solution) and the metal salt solution are mixed, a single phase results or remains. In an alternative embodiment, the metal salt solution could be a single phase prior to addition of the capping agent or capping agent solution, and, upon addition of the capping agent or capping agent solution a single phase remains. Additional embodiments where a metal solution and a capping agent are mixed to provide a single phase will be readily selected by the person of ordinary skill in the art, given the benefit of this disclosure. In certain examples, the capping agent and the metal solution may be mixed using conventional techniques such as stirring, sonication, agitation, vibration, shaking or the like. In some examples, the capping agent may be added to the metal solution while the metal solution is being stirred. In certain examples, the mixture of capping agent and metal solution may be stirred until a clear and/or colorless single phase solution results.

In accordance with certain examples, a reducing agent may be added to the metal-capping agent solution prior to, of after, deposition on a substrate. Suitable reducing agents include agents that can convert the metal ions dissolved in the solution to metal particles that, under selected conditions, will precipitate out of solution. Illustrative reducing agents include, but are not limited to, sodium borohydride, lithium aluminum hydride, sodium cyanoborohydride, potassium borohydride, sodium triacetoxyborohydride, sodium diethyldihydridoaluminate, sodium tri- or tert-butoxohydridoaluminate, sodium bis(2-methoxyethoxo)dihydridoaluminate, lithium hydride, calcium hydride, titanium hydride, zirconium hydride, diisobutylaluminum dydride (DIBAL-H), dimethylsulfide borane, ferrous ion, formaldehyde, formic acid, hydrazines, hydrogen gas, isopropanol, phenylsilane, polymethylhydrosiloxane, potassium ferricyanide, silanes, sodium hydrosulfite, sodium amalgam, sodium (solid), potassium (solid), sodium dithionite, stannous ion, sulfite compounds, tin hydrides, triphenylphosphine and zinc-mercury amalgam. The exact amount of reducing agent added to the metal-capping agent solution may vary, but typically the reducing agent is added in excess such that substantially all of the dissolved metal is converted from a charged state to an uncharged state, e.g., $Ag^{+1}$ may be converted to $Ag^0$. In some examples, the reducing agent may be dissolved in a solvent prior to addition to the metal-capping agent solution, whereas in other examples, the reducing agent may be added to the metal-capping agent solution without prior dissolution. When a solvent is used to dissolve the reducing agent, the solvent is preferably non-reactive such that the solvent is not altered or changed by the reducing agent. Illustrative solvents for use with the reducing agent include, but are not limited to, tetrahydrofuran (THF), N,N-dimethylformamide (DMF), ethanol, toluene, heptane, octane and solvents having six or more carbon atoms, e.g., linear, cyclic or aromatic solvents having six or more carbon atoms. The person of ordinary skill in the art, given the benefit of this disclosure, will be able to select suitable solvents for dissolving the reducing agent.

In accordance with certain examples, the reducing agent and capping agent-metal solution may be mixed or stirred for a sufficient time to permit reaction of the reducing agent with the metal. In some examples, the stirring may be performed at room temperature, whereas in other examples the stirring or mixing is performed at an elevated temperature, e.g., about 30° C. to about 70° C., to speed the reduction process. When an elevated temperature is used, it is desirable to keep the temperature below the boiling point of the solvent or solvent system to reduce the likelihood of solvent evaporation, though in some examples, it may be desirable to reduce the overall volume of solvent.

In accordance with certain examples, the metal particles may be isolated from the single phase solution prior to deposition on a substrate. Isolation may occur, for example, by decanting, centrifugation, filtering, screening or addition of another liquid that the capped metal particles are insoluble in, e.g., extraction. For example, a liquid, such as methanol, acetone, water or a polar liquid, may be added to an organic solution obtained from adding metal salt, capping agent and reducing agent to an organic solvent or organic solvent system. In certain examples, multiple, separate additions of the extraction liquid may be added to the solution to remove the capped metal particles. For example, a first amount of extraction liquid may be added to remove some of the metal particles. This first amount of extraction liquid may then be removed, decanted or otherwise separated from the organic solution, and additional amounts of the extraction liquid may be added to the organic solution. The exact amount of extraction liquid used to isolate the metal particles may vary depending on the volume of solvent used to produce the capped metal particles. In some examples, about two to four times or more solvent is used to extract the capped metal particles, e.g., if the metal particles are produced in about five Liters of solvent, then about 20 Liters or more of extraction liquid may be used. It will be within the ability of the person of ordinary skill in the art, given the benefit of this disclosure, to select suitable solvents and amounts of suitable solvents.

In accordance with certain examples, the capped particles may be separated from the extraction liquid using conventional techniques such as decanting, centrifugation, filtration and the like. In some examples, the extraction liquid may be evaporated leaving the capped particles. The capped particles may be washed, sized, heated or otherwise processed prior to, during or after separation from the extraction liquid. In certain embodiments, the extraction liquid may be used, optionally along with one or more solvents, as a carrier fluid to provide an ink, as discussed in more detail herein. In other examples, the capped metal particles may remain in a single phase solution and the particles may be disposed on a sintering substrate in, for example, a mold or form on the substrate. The high temperatures of the sintering process results in evaporation of the solvent and sintering of the metal particles.

In accordance with certain examples, the capped particles may be dried to remove any residual liquids. For example, the capped particles may be dried in an oven, may be dried using a vacuum, or may be subjected to lyophilization to otherwise remove any residual extraction liquid and/or solvent. The dried, capped particles may be stored at room temperature optionally in a sealed container to prevent moisture entry. In an alternative embodiment, a separate drying step may be omitted, and the particles may be dried during the sintering process.

In accordance with certain examples, the capped particles may be processed to remove the capping agent prior to use. The capping agent typically remains on the surface of the particles after the reaction, but the presence of a capping agent may be undesirable. For example, where it is desirable to use particles with the lowest level of organic contamination possible, it would be advantageous to remove the capping agent from the capped particles. In certain embodiments, the capped particles may be processed until the level of capping agent is reduced below about 2% by weight, more particularly reduced to below about 1% by weight, e.g., the capping agent is present at less than 0.5% or 0.1% by weight.

In accordance with certain examples, the metal particles may be used to provide an ink that may be used to deposit the metal particles on a sintering substrate. In some examples, a selected amount of particles are dispersed in a carrier to provide an ink. The exact amount of the particles selected may vary, and typically a suitable amount of particles (either capped or uncapped) are used to provide a dispersion including about 10-90 weight percent particles, more particularly about 20-80 weight percent particles, e.g., about 20-25 weight percent particles. In embodiments where capped particles are used, the amount of the capped particles used may be altered to account for the additional weight added by the capping agent. In other examples, a sufficient amount of particles are used to provide a desired viscosity for the dispersion. For example, the viscosity of the dispersion may vary depending on the method or devices that the ink is to be used in. In examples where the ink is intended to be used in spin coating applications, a sufficient amount of particles may be selected to provide an ink viscosity of about 0.25 centiPoise to about 2 centiPoise, more particularly about 0.5 centiPoise to about 1.5 centiPoise, e.g., about 1 centiPoise. In examples where the ink is intended to be used in inkjet printing applications, a sufficient amount of particles may be selected to provide an ink viscosity of about 5 centiPoise to about 20 centiPoise, more particularly about 7 centiPoise to about 15 centiPoise, e.g., about 8-10 or 8-9 centiPoise. Additional ink viscosities for depositing the ink on a sintering substrate using a selected method will be readily selected by the person of ordinary skill in the art, given the benefit of this disclosure.

In accordance with certain examples, the carrier of the ink may be any medium or fluid, e.g., a liquid or a gas, that can effectively disperse the particles in a selected manner, e.g., spin coating, inkjet printing, screen printing, paste printing, etc. In certain examples, the carrier may be a volatile organic medium that can be evaporated or removed to leave a coating or film of the particles on a sintering substrate. Illustrative volatile organic media include, but are not limited to, toluene, hexanes, and saturated and unsaturated hydrocarbons including from about 4 to about 10 carbon atoms. In an alternative configuration, the carrier may be selected such that it is volatile at the sintering temperature such that the carrier fluid evaporates during the sintering process. Additional suitable carriers will be readily selected by the person of ordinary skill in the art, given the benefit of this disclosure.

Figure 1:
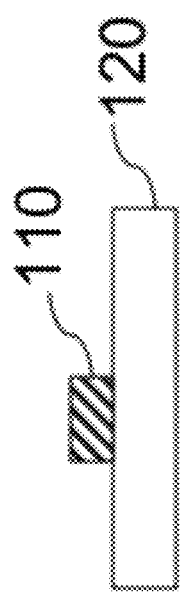
FIG. 1 is schematic of a conductive material disposed on a substrate, in accordance with certain examples.

In accordance with certain examples and referring to FIG. 1, in producing the devices disclosed herein, a material 110 may be deposited on a substrate 120. The material may be deposited in numerous manners including, but not limited to, vapor deposition, screen printing, ink-jet printing, painting, brushing, dispensing and the like. In examples where the material is a fluid, the material may be deposited in a mold or form (not shown) such that it is held in place prior to sintering. The mold or form may be produced from high temperature material such as, for example, metals, glass, ceramics and the like. The exact thickness, width, length and geometry of the deposited material may vary depending on the end use of the electrical conductor. In some examples, the electrical conductor may be deposited to a thickness of about 0.1 microns to about 5 microns prior to sintering. In other examples, the length and width of the conductor may depend, at least in part, on the geometry of the conductor. In examples where the electrical conductor is deposited as a line, the length may be, for example, about 5 mm to about 300 mm and the width may be, for example, about 0.1 mm to about 5 mm. Other lengths and widths will be readily selected by the person of ordinary skill in the art, given the benefit of this disclosure, based on a particular geometry or pattern.

In accordance with certain examples, subsequent to deposition of the material 110 on the substrate 120, the material 110 and the substrate 120 may be sintered. Sintering may be performed to compact the material and decrease the overall volume of the material 110. As the material compact, the conductive particles pack closer together which assists in lowering the electrical resistance of the material. The sintering time and temperature may vary depending on the material or materials selected for use in the electrical conductors. In some examples, the sintering temperature may vary from about 250-300° C., whereas in other examples, the sintering temperature may be above 300° C. but is preferably less than the melting point of the material or materials deposited on the substrate. The time used to sinter the material may also vary, and in some examples sintering is performed until there is no further compacting or volume decrease in the deposited material on the substrate.

In certain examples, sintering may be accomplished using numerous devices and methods. In one embodiment, the substrate and deposited material may be placed in an oven and heated to a suitable temperature for a sufficient period. The temperature of the oven may be ramped or cycled between two or more temperatures during the sintering process, or the temperature may be fixed. In other examples, the deposited material may be laser sintered using, for example, a high power laser such as a carbon dioxide laser to fuse particles of the deposited material into a mass that provides an electrical conductor. The laser may fuse the material, for example, by scanning cross-sections of the deposited material. The laser may be attached to a robotic arm that can move the laser over the material to be sintered. Additional methods of sintering will be readily selected by the person of ordinary skill in the art, given the benefit of this disclosure.

In accordance with certain examples, after the material 110 has been sintered to provide an electrical conductor, the electrical conductor may be transferred to its intended device or place, e.g., to a heat sensitive substrate. In certain examples, transfer may be effectuated by removal of the conductor, e.g., either manually or in an automated manner using, for example, pick-and-place equipment, from the sintering substrate and placement of the conductor on the heat sensitive substrate at a suitable location. In many instances, however, the electrical conductor may be adhered or otherwise stuck to the sintering substrate such that release of the electrical conductor from the sintering substrate is desirable prior to transfer to the heat sensitive substrate.

In certain examples, the electrical conductor may be exposed to one or more release agents or release fluids to facilitate removal of the electrical conductor from the sintering substrate. In some examples, the release agent or fluid may be sprayed around the base of the electrical conductor and allowed to penetrate under the electrical conductor to facilitate release. In other examples, the sintered electrical conductor and substrate may be immersed or submerged into the release agent or release fluid such that the electrical conductor loses adherence to the substrate. The electrical conductor itself may not actually dissociate or fall off of the substrate, but subsequent transfer of the electrical conductor to the heat sensitive substrate is easier and/or more rapid. The exact nature of the release agent or release fluid may vary depending on the materials used to produce the electrical conductor. In certain examples, the release agent or fluid is substantially inert toward the electrical conductor and/or the substrate such that no unwanted chemical reactions or modification of the electrical conductor occurs. In some examples, the release agent or fluid may be, or may include an acidic material. For example, an aqueous solution of sulfuric acid, acetic acid, hydrochloric acid or other strong or weak acids that may be effective to cause or assist release of the electrical conductor. The exact concentration of the acid in the release fluid may vary, and in certain examples, the concentration is less than or equal to 0.1 moles/Liter. In other examples, the release agent or fluid may be, or may include a basic material. Illustrative basic materials include, but are not limited to, hydroxides, acetates, carbonates, and other strong and weak bases that may be effective to cause or assist release of the electrical conductor.

In accordance with certain examples, the sintered material may also be covered, attached to, electroplated with or otherwise receive an additional material such as a metal or a metal compound on one or more surfaces. It may be desirable to design the sintered material to be relatively thin such that it may function as a seed site where additional conductive material may be deposited. Such additional materials may be provided to the sintered material prior to or after exposure of the sintered material to the release agent or fluid. In some examples, the additional material may be deposited using physical vapor deposition or chemical vapor deposition techniques, whereas in other examples the additional material may be brushed, coated, painted or otherwise disposed on one or more surfaces of the sintered material. In certain examples, the additional material may be electroplated or electrodeposited onto the sintered material. Electrodeposition typically does not require masking of the substrate, and the deposition occurs desirably on conductive metallic surfaces, which permits building up of the material in a rapid and easy manner. In certain examples, the electroplating may occur subsequent to release of the sintered material from the sintering substrate, whereas in other examples the sintering substrate and sintered material on the sintering substrate may be exposed to an electroplating solution or bath. In examples where the electroplating is performed prior to release of the sintered material from the substrate, the electroplating process may enhance or assist release of the sintered material from the substrate. Referring to FIG. 2, the electroplating may be performed by immersing the sintered material 220 and the sintering substrate 210 in an electrolyte bath 230, e.g., a $CuSO_4$ bath, and applying a current to the electrolyte bath 230 with, for example, the sintered material 220 functioning as the cathode to coat or deposit electrolyte in the electrolyte bath 230 on the sintered material 220. In some examples, the electroplating process may be used to provide an electrical conductor having a desired overall thickness. For example, it may be desirable to deposit about 0.1 mm to about 0.5 mm of additional material on the sintered material to provide a conductor having an overall thickness of about 0.5 mm to about 0.6 mm. An increased amount of material may be deposited or electroplated on the sintered material to increase the overall thickness, whereas a decreased amount of material may be deposited or electroplated on the sintered material to decrease the overall thickness. It will be within the ability of the person of ordinary skill in the art, given the benefit of this disclosure, to select suitable amounts of material to deposit on the sintered material to provide an electrical conductor.

In accordance with certain examples, the sintered material may be transferred to a heat sensitive substrate directly or through one or more intermediate devices. In examples where the sintered material is transferred directly to the heat sensitive substrate, the heat sensitive substrate may be contacted with the sintered material on the sintering substrate so that transfer is effectuated to the heat sensitive substrate. This process is shown schematically in FIGS. 3A-3C. Referring to FIG. 3A, an electrical conductor 310 is shown as being disposed on a substrate 320. The electrical conductor 310 may already be sintered, e.g., to the substrate 320, and/or include one or more additional materials disposed thereon. A heat sensitive substrate or layer 330 may be placed on the conductive material 310 (see FIG. 3B) such that a desired portion of the heat sensitive substrate or layer 330 contacts the conductive material 310. The heat sensitive substrate or layer 330 may include one or more adhesives or tacky substances or coatings (not shown) at a selected area to facilitate transfer of the electrical conductor 310 and sticking or adhering of the electrical conductor 310 to the heat sensitive substrate or layer 330. The substrate 310 may be pulled off, peeled away or otherwise removed from the electrical conductor 310 such that the electrical conductor 310 is transferred to the heat resistive substrate or layer 330, as shown in FIG. 3C. The heat sensitive substrate or layer 330 with the electrical conductor 310 may be further processed or treated or additional electrical conductors may be added to other portions of the heat sensitive substrate or layer 330.

In other examples, the electrical conductor may be transferred to an intermediate substrate or device prior to final transfer to the heat sensitive substrate. This process may be desirable to provide a pattern of electrical conductors on the intermediate substrate that could subsequently be transferred to the heat sensitive substrate thus avoiding multiple, different transfer steps using the heat sensitive substrate. The intermediate substrate may be any device that can retain, at least for some period, the electrical conductor prior to transfer to the heat sensitive substrate. In some examples, the intermediate substrate may be a paper-based material optionally including a non-stick coating such that the conductors may be retained on, but not substantially adhered to, the intermediate substrate.

An example of using an intermediate substrate is shown in FIGS. 4A-4D. Referring to FIG. 4A, an electrical conductor 410 may be transferred from a sintering substrate 420 to an intermediate substrate 430 having another electrical conductor 440 already disposed thereon by contacting the electrical conductor 410 with the intermediate substrate. Subsequent to transfer, the intermediate substrate 430 includes both the electrical conductor 410 and the electrical conductor 440 (see FIG. 4B). Additional electrical conductors (not shown) may also be disposed on the intermediate substrate 430 to form a desired pattern or shapes. Once a desired pattern is achieved on the intermediate substrate 430, the electrical conductors 410 and 440 may be transferred and optionally laminated to a heat sensitive substrate 450, as shown in FIG. 4C, by contacting the heat sensitive substrate 450 with the electrical conductors 410 and 440. Subsequent to transfer, the heat sensitive substrate 450 and electrical conductors 410 and 440 may be separated or otherwise removed from the intermediate substrate 430 to provide a heat sensitive substrate 450 with electrical conductors 410 and 440 disposed thereon, as shown in FIG. 4D.

In certain examples, the electrical conductors 410 and 440 may have one or more material electrodeposited on them subsequent to transfer to the intermediate substrate 430. For example, where it is desirable to electroplate all of the electrical conductors of a device, to reduce the number of steps in the process, all of the electrical conductors may first be transferred to the intermediate substrate 430, and the assembly may be placed in an electrolyte bath such that all of the electrical conductors receive a material through the electroplating process. Subsequent to electroplating, the conductors may be transferred, for example, as shown in FIGS. 4A-4C. Additional methods of using an intermediate substrate to produce electrical conductors on a heat sensitive substrate will be readily selected by the person of ordinary skill in the art, given the benefit of this disclosure.

In accordance with certain examples, when an adhesive or tacky substance is used to facilitate transfer to the heat sensitive substrate, the adhesive or tack substance preferably does not interfere with the overall functioning of the electrical conductor. In some examples, the intermediate substrate may include a flexible or tacky flux to facilitate transfer and optionally subsequent soldering of the electrical conductor to the heat sensitive substrate. Illustrative fluxes are described, for example, in commonly assigned U.S. Patent Application Nos. 60/883,404 and 60/941,950 and International Patent Application No. PCT/US2007/81037, the entire disclosure of each is hereby incorporated herein by reference for all purposes. In other examples, a conductive adhesive may be used to facilitate transfer of the electrical conductor to the heat sensitive substrate. Illustrative conductive adhesives include, but are not limited to, silver epoxy, aluminum epoxy and other conductive epoxies. Additional materials for use in facilitating transfer of the electrical conductor to the heat sensitive substrate will be readily selected by the person of ordinary skill in the art, given the benefit of this disclosure.

In accordance with certain examples, a kit for use in producing an electrical conductor is also disclosed. In certain examples, the kit may include a first substrate, a heat sensitive substrate, an ink and instructions. In some examples, the first substrate may be configured to withstand a sintering temperature, e.g., may be a sintering substrate as described herein. In other examples, the heat sensitive substrate may be configured to degrade at or above the sintering temperature. In additional examples, the ink may comprise metal particles in a carrier selected to deposit a conductive material onto at least a portion of the first substrate, such as the illustrative metal particles described herein, e.g., capped or uncapped metal particles. In certain examples, the kit may further include instructions for using the first substrate, the heat sensitive substrate, and the ink to produce an electrical conductor on the heat sensitive substrate.

In accordance with certain examples, a method of producing an electrical conductor on a heat sensitive substrate is provided. In certain examples, the method comprises disposing a conductive material on a first substrate capable of withstanding a sintering temperature. Illustrative substrates and illustrative sintering temperatures are described herein. In some examples, the method may further include sintering the conductive material at the sintering temperature to form an electrical conductor. Sintering may be accomplished as described herein, e.g., using an over, laser or other suitable devices. In certain examples, the method may further include transferring the electrical conductor to a heat sensitive substrate that degrades at or above the sintering temperature. Transferring may be accomplished or facilitated using an adhesive or similar substance on the heat sensitive substrate and optionally may occur in combination with lamination. In some examples, the conductive material that is deposited on the first substrate may be produced by mixing a metal or a metal salt with a capping agent to provide a nanoink, as described elsewhere herein, e.g., using a single phase solution. Such conductive materials may be disposed in numerous manners including spin coating, inkjet printing, screen printing, paste printing or combinations thereof. In some examples, during the transfer step, the electrical conductor may be released from the first substrate prior to transferring the electrical conductor to the heat sensitive substrate using, for example, a release agent or fluid, e.g., by exposing the electrical conductor to an acidic solution or a basic solution. In certain examples, prior to or after transfer to the heat sensitive substrate, one or more material may be electrodeposited on the electrical conductor.

In accordance with certain examples, the devices, kits and methods disclosed herein may be particularly useful in producing various components of solar cells, such as solar cell contact and solar cell collectors. In particular, the heat damage that may occur using existing methods of producing solar cells may be avoided by producing an electrical conductor on one substrate and subsequently transferring it to a heat sensitive component or feature in a solar cell. It will be within the ability of the person of ordinary skill in the art, given the benefit of this disclosure, to use the devices, methods and kits disclosed herein for the production of solar cells and solar cell components. In one example, the devices and methods disclosed herein may be used to provide a collecting grid for thin film solar cells. Such cells are typically multiplayer structures of thin film semi-conducting material that may undergo undesirable interdiffusion at temperatures more then 200° C. In existing processes, such cells are usually printed (deposited) on polymer substrates which can not be heated above 200° C. Using the devices and methods disclosed herein, the collecting grind may be manufactured, for example, on a ceramic substrate and then transferred/ glued to the top of the solar cell with a conductive epoxy. One advantage of such dual structure compared to the collecting grids made solely of silver epoxy is substantially higher conductivity. For example, resistivity of best silver epoxy is 150-200 microOhm-cm, while resistivity of nanosilver printed lines is about 3 microOhm-cm. Additional advantages of using the methods and devices disclosed herein in producing collecting grids will be readily selected by the person of ordinary skill in the art, given the benefit of this disclosure.

Certain specific examples are described below to provide a better understanding of certain features, aspects, embodiments and examples described herein.

EXAMPLE 1

One embodiment of process to produce an electrical conductor is shown schematically in FIGS. 5A-5F. This process includes printing (FIG. 5A), sintering (FIG. 5B), releasing (FIG. 5C), electroplating (FIG. 5D), laminating (FIG. 5E) and formation of a final structure (FIG. 5F). In the printing step, an electrical circuit is inkjet printed or screen printed (FIG. 5A) on substrates which can withstand temperature at or above 300° C. Such substrates may be, for example, glass, silicon, and Kapton™ films. The ink or paste is a nanosilver powder based ink, such as Alpha n:1000-IJ commercially available from Cookson Electronics (Jersey City, N.J.).

In the sintering step (FIG. 5B), the printed structure is sintered in an oven at 250-300° C. to form an electrical conductor. As printed and sintered-silver lines have good adhesion to glass, Si or Kapton® polyimide film. In order to be transferred, the printed structures are desirably released from the substrate (FIG. 5C). Exposure of printed structures to aqueous acidic or alkaline solutions reduces adhesion, or causes loss of adhesion, to the printed substrates. Neither acid nor base chemically attack silver therefore as a result of the exposure (about 1 min in 0.1 M $H_2SO_4$), the printed and sintered silver structure will remain on the substrate (FIG. 5C).

For cost savings considerations, it is often desirable to print very thin silver traces which serve as a seed layer for following electroplating of copper (or other metal) to increase lines thickness. Electroplating (FIG. 5D) on sintered silver traces can increase the thickness of lines by electrodepositing copper and at the same time can affect the bonding of the silver lines to the substrate in the way that after electroplating the circuitry can be easily lifted from the substrates.

During the transfer step (FIG. 5E), the printed structures can be transferred easily to another substrate like plastic or polymer by lamination process or with a help of an adhesion layer. The adhesion layer need not include an actual adhesive. If the adhesion layer interacts with or bonds to the printed structure more tightly than the substrate, then transfer of the printed structure may be effectuated (see FIG. 5F).

EXAMPLE 2

Figures 6A, 6B:
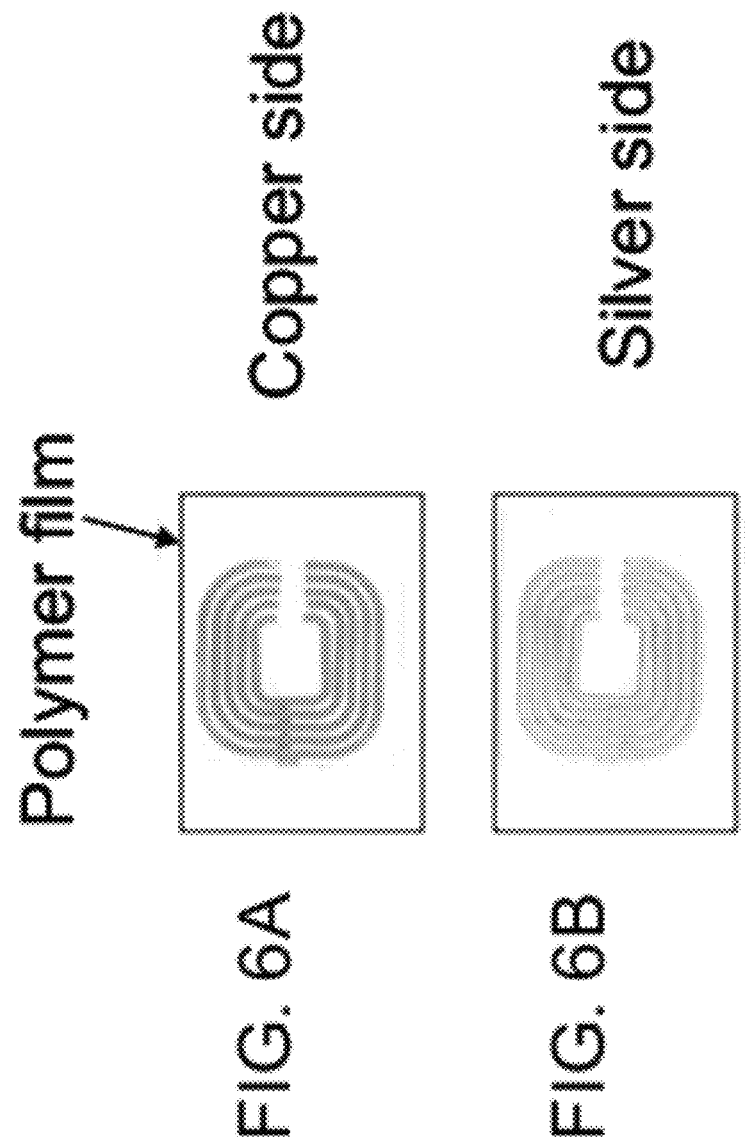
FIGS. 6A and 6B are pictures of a conductor printed as a symbol, in accordance with certain examples.

Referring to FIGS. 6A and 6B, a symbol was inkjet printed, using a Dimatix (Santa Clara, Calif.) material printer, on glass using nanosilver ink n:1000 IJ commercially available from Cookson Electronics. The printed symbol was electroplated with copper in solution containing 200 g/L $CuSO_4$ and 50 g/L $H_2SO_4$. After electroplating the printed structure, the electroplated, printed structure was transferred/laminated to a transparent adhesive polymer film (Polypropylene film laminated at 100° C. with rolling pressure). The copper side and the silver side are shown in FIGS. 6A and 6B, respectively.

When introducing elements of the examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples may be interchanged or substituted with various components in other examples.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. A method of producing an electrical conductor on a heat sensitive substrate, the method comprising:
    disposing a conductive material on a first substrate capable of withstanding a sintering temperature;
    sintering the conductive material at the sintering temperature to form an electrical conductor; and
    transferring the electrical conductor to a heat sensitive substrate that degrades at or above the sintering temperature.

2. The method of claim 1, further comprising producing the conductive material disposed on the first substrate by mixing a metal or a metal salt with a capping agent.

3. The method of claim 2, wherein the metal or the metal salt is mixed with the capping agent in a single phase solution.

4. The method of claim 1, in which the disposing step comprises at least one of spin coating, inkjet printing, screen printing, paste printing or combinations thereof.

5. The method of claim 1, further comprising releasing the electrical conductor from the first substrate prior to transferring the electrical conductor to the heat sensitive substrate.

6. The method of claim 5, in which the releasing step comprises exposing the electrical conductor to an acidic solution.

7. The method of claim 5, in which the releasing step comprises exposing the electrical conductor to a basic solution.

8. The method of claim 1, in which the transferring step comprises laminating the electrical conductor to the heat sensitive substrate.

9. The method of claim 1, in which the transferring step comprises adhering the electrical conductor to the heat sensitive substrate using an adhesive or tacky substance.

10. The method of claim 1, further comprising electrodepositing an additional material onto the electrical conductor.

11. The method of claim 10, further comprising releasing the electrodeposited, electrical conductor from the first substrate prior to transferring the electrodeposited, electrical conductor to the heat sensitive substrate.

\* \* \* \* \*